US006713329B1

(12) United States Patent
Wagner et al.

(10) Patent No.: US 6,713,329 B1

(45) Date of Patent: Mar. 30, 2004

(54) **INVERTER MADE OF COMPLEMENTARY *P* AND *N* CHANNEL TRANSISTORS USING A SINGLE DIRECTLY-DEPOSITED MICROCRYSTALLINE SILICON FILM**

(75) Inventors: Sigurd Wagner, Princeton, NJ (US); Yu Chen, Milpitas, CA (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 10/030,371

(22) PCT Filed: May 10, 2000

(86) PCT No.: PCT/US00/12762

§ 371 (c)(1),
(2), (4) Date: Mar. 6, 2002

(87) PCT Pub. No.: WO00/68978

PCT Pub. Date: Nov. 16, 2000

Related U.S. Application Data

(60) Provisional application No. 60/133,372, filed on May 10, 1999.

(51) Int. Cl.[7] .......................... H01L 21/00; H01L 21/84

(52) U.S. Cl. ....................... 438/154; 438/151; 438/153; 157/64; 157/347

(58) Field of Search ................................ 438/151, 153, 438/154; 157/64, 347

(56) References Cited

U.S. PATENT DOCUMENTS

| | | | | | |
|---|---|---|---|---|---|
| 4,889,609 | A | | 12/1989 | Cannella | 204/298 |
| 4,980,303 | A | | 12/1990 | Yamauchi | 437/31 |
| 5,223,449 | A | | 6/1993 | Morris et al. | 437/51 |
| 5,576,229 | A | | 11/1996 | Murata et al. | 437/40 |
| 5,766,989 | A | | 6/1998 | Maegawa et al. | 438/166 |
| 5,808,316 | A | | 9/1998 | Matsuda et al. | 257/66 |
| 5,834,071 | A | * | 11/1998 | Lin | 427/878 |
| 5,899,709 | A | | 5/1999 | Yamazaki et al. | 438/151 |
| 5,923,050 | A | * | 7/1999 | Jang et al. | 257/57 |
| 5,946,561 | A | | 8/1999 | Yamazaki et al. | 438/166 |
| 5,959,312 | A | * | 9/1999 | Tsai et al. | 427/39 |
| 5,962,896 | A | | 10/1999 | Yabuta et al. | 257/347 |
| 6,037,610 | A | | 3/2000 | Zhang et al. | 257/64 |
| 6,100,466 | A | | 8/2000 | Nishimoto | 136/258 |

OTHER PUBLICATIONS

Chen et al. "Effects of Grow Parameters on the Performance of uc–Si TFTs", Electrochemical Society Proceedings, vol. 98–22, pp. 221–229 (1998).*

Chen et al. "TFTs of uc–Si deposided by PECVD", Mat. Rec. Soc. Symp. Proc., 557:665–670, 1999.*

Chen, et al., "Effects of Growth Parameters on the Performance of uc–Si Thin Film Transistors Deposited Using SiF4," Electrochemical Society Proceedings vol. 98–22, pp. 221–229 (1998).

Meiling, et al., "Transistors With a Profiled Active Layer Made by Hot–Wire CVD," Mat. Res. Soc. Symp. Proc. vol. 507, pp. 31–36, (1998).

Nagahara, et al., "In–Situ Chemically Cleaning Poly–Si Growth at Low Temperature," Jpn., J. Appl. Phys. vol. 31, pp. 4555–4558 (1992).

(List continued on next page.)

*Primary Examiner*—John F. Niebling
*Assistant Examiner*—Viktor Simkovic
(74) *Attorney, Agent, or Firm*—Wolff & Samson PC

(57) ABSTRACT

A p channel thin-film transistor (TFT) made of directly deposited microcrystalline silicon (uc-Si). The p TFT is integrated with its n channel counterpart on a single uc-Si film, to form a complementary metal-silicon oxide-silicon (CMOS) inverter of deposited uc-Si. The uc-Si channel material can be grown at lower temperatures by plasma-enhanced chemical vapor deposition in a process similar to the deposition. The p and n channels share the same uc-Si layer. The Figure shows the processing steps of manufacturing the TFT, where (12) represents the uc-Si layer of the device.

19 Claims, 4 Drawing Sheets

OTHER PUBLICATIONS

Woo, et al., "Polycrstalline Silicon Thin Film Transistors Deposited at Low Substrate Temperature by Remote Plasma Chemical Vapor Deposition Using SiF4/H2," App. Phys. Lett. vol. 65, No. 13, pp. 1644–1646 (1994).

Chen, Yu et al., "Low Temperature Growth of Nanocrystal Silicon From SiF4+SiH4," Mat. Res. Soc. Symp. Proc., 424:103–107, 1997.

Chen, Y. and Wagner, S., "Thin Film Transistors of Microcrystalline Silicon Deposited By Plasma Enhanced–CVD," Mat. Res. Soc. Symp. Proc., 557:665–670, 1999.

Ma, E.Y. and Wagner, S., "Amorphous silicon transistors on ultrathin steel foil substrates," Applied Physics Letters, 74(18):2661–2662, May 1999.

Meier, J. et al., "Complete microcrystalline p–i–n solar cell—Crystalline or amorphous cell behavior?," Applied Physics Letters, 65(7):860–862, Aug. 1994.

Nakata, M., "Growth Processes of Silicon Thin Films in Various Structural Phases Manufactured from Silicon Tetrafluoride at Low Temperatures," thesis, Tokyo Institute of Technology, Department of Electronic Chemistry, 1992.

Schneider, B. et al., Image Sensors in TFA (Thin Film on ASIC) Technology, Handbook of Computer Vision and Applications, vol. 1, pp. 237–270, Academic Press, 1999.

Yang, J. et al., "Triple–junction amorphous silicon alloy solar cell with 14.6% initial and 13.0% stable conversion efficiencies," Applied Physics Letters, 70(22):2975–2977, Jun. 1997.

* cited by examiner

INVERTER MADE OF COMPLEMENTARY *P* AND *N* CHANNEL TRANSISTORS USING A SINGLE DIRECTLY-DEPOSITED MICROCRYSTALLINE SILICON FILM

RELATED APPLICATIONS

This application claims the benefit of provisional application U.S. Ser. No. 60/133,372 filed May 10, 1999. This application is incorporated herein by reference.

GOVERNMENT RIGHTS

The present invention has been made under a contract by the New Jersey Commission of Science and Technology and DARPA and the government may have certain rights to the subject invention.

BACKGROUND OF THE INVENTION

1. Field of the Invention

This invention generally relates to the fabrication of large area electronic products, and more specifically to the fabrication of complimentary metal-oxide semiconductor (CMOS) circuits for add-on electronics for application-specific integrated circuits (ASICs), at low temperatures by directly depositing microcrystalline thin-film silicon (μC-Si).

2. Related Art

It is known how to make CMOS circuits at temperatures in excess of 600° C., which is the lowest temperature at which polycrystalline films can be made by thermal crystallization. These films are then processed to CMOS circuits.

An ultralow-temperature, large-area silicon technology that could furnish a tool kit of standard devices, including transistors, rectifying diodes and photodiodes is of great interest for applications in macroelectronics, and in add-on electronics for application-specific integrated circuits. The latter application of the process temperature expands the applicability of macroelectronics. A widely usable ultralow-temperature technology needs p channel and n channel field-effect transistors (FETs), which are the building blocks for complementary digital circuits n channel FETs made of directly deposited microcrystalline silicon (μc-Si) indeed have been reported by: T. Nagahara, K. Fuiimoto. N. Kohno. Y. Kashiwapi and H. Kakinoki, Jpn. J. Appl. Phys. 31, 4555 (1992); J. Woo, H. Lim and J. Jane, Appl. Phys. Lett. 65, 1644 (1994); H. Meiling, A. M. Brockhoff J. K. Rath and R.E.I. Schropr), Mat. Res. Soc. Symp. Proc. 508, 31 (1998); and Y. Chen and S. Wagner, Electrochem. Soc. Proc. 98-22, 221 (1998). The fabrication of solar cells of μc-Si suggests that useful hole mobilities can be obtained in μc-Si. However, no p channel thin film transistors (TFTs):have been made of hydrogenated amorphous silicon (a-Si:H), which is an efficient solar cell material.

What would be desirable, but has not heretofore been developed, is a method of fabricating macroelectronic devices and ASICs at low temperatures by directly depositing μc-Si and integrating a p channel TFT with an n channel TFT to form an inverter.

OBJECTS AND SUMMARY OF THE INVENTION

It is a primary object of the present invention to provide a method of making large area electronic devices at low temperatures.

It is another object of the present invention to provide a method of making CMOs circuits at low temperatures.

It is another object of the present invention to provide a method of making TFTs by directly depositing μc-Si.

It is an additional object of the present invention to provide a method of integrating p channel and n channel TFTs to form an inverter.

It is even a further object of the present invention to provide a method for making p channel and n channel transistors from the same film of μc-Si.

It is even an additional object of the present invention to provide a TFT wherein the p and n channels share a single μc-Si layer.

A p channel TFT is made of directly deposited microcrystalline silicon (μc-Si). The p TFT is integrated with its n channel counterpart on a single μc-Si film, to form a complementary metal-silicon oxide-silicon (CMOS) inverter of deposited μc-Si. The μc-Si channel material can be grown at low temperatures by plasma-enhanced chemical vapor deposition in a process similar to the deposition of hydrogenated amorphous silicon. Either the $p^+$ or $n^+$layers can be grown and patterned, and then the other can be deposited and patterned. The p and n channels share the same μc-Si layer.

BRIEF DESCRIPTION OF THE DRAWINGS

Other important objects and features of the invention will be apparent from the following Detailed Description of the Invention taken in connection with the accompanying drawings in which.

DETAILED DESCRIPTION OF THE INVENTION

Figure 1A:
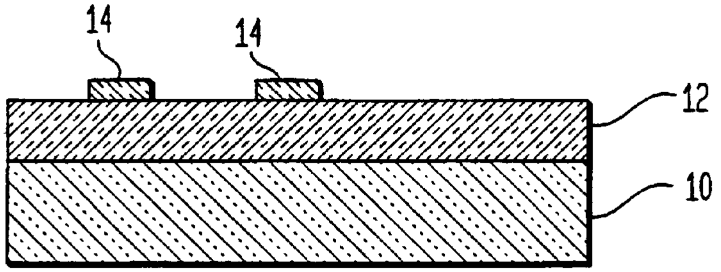
FIGS. 1A–1F are schematic views of the process sequence for the microcrystalline silicon CMOS inverter according to the present invention.

The present invention relates to ultralow-temperature semiconductor technology based on directly deposited μc-Si. One aspect of the invention is the successful fabrication of p channel thin-film transistors deposited at 320° C. and processed at a maximum temperature of 280° C. Another aspect of the invention is the integration of this p channel TFT, with an n channel TFT to an inverter to create a complementary metal-oxide-silicon (CMOS) circuit made of microcrystalline silicon.

The μc-Si CMOS process of the present invention is described with reference to FIG. 1. Both the p type and the n type TFT use one single directly deposited μc-Si layer 12 as the conducting channel. The μc-Si channel material 12 can be grown by plasma-enhanced chemical vapor deposition (PECVD) in a process similar to the deposition of a-Si:H. The undoped channel and the $p^+$ and $n^+$ contact layers, 14 and 20 respectively, can be grown by PECVD. The $SiO_2$ gate dielectric 16 can also be grown by PECVD. Corning 7059 glass can be used as the substrate 10. The channel layers of undoped i μc-Si can be grown by DC excitation of a mixture of $SiH_4$, $SiF_4$ and $H_2$. Adding $SiF_4$ to the source gas provides a large deposition space than deposition from $H_2$-diluted $SiH_4$ alone. The growth rate was 0.6 Å/s at a power density of 160 mW/cm$^2$. The dark conductivity of the i μc-Si is 1×10$^{-7}$ S/cm, and its thermal activation energy is 0.55eV. The p$^+$ and n$^2$ source/drain contact layers were grown from SiH$_4$, H$_2$, and B$_2$H$_6$ or PH$_3$ by RF excitation at 13.56 MHz. Their dark conductivities are 0.01 S/cm (p$^+$ μc-Si) and 20 S/cm (n$^+$ μc-Si). Growth parameters are listed in Table 1.

TABLE 1

Deposition parameters for the undoped microcrystalline silicon of the TFT channels, the dopes source/drain contact layers, and the SiO$_2$ used for isolation.

| Layer | SiH$_4$ (sccm) | H$_2$ (sccm) | SiF$_4$ (sccm) | PH$_3$, B$_2$H$_6$, Or N$_2$O (sccm) | Temp. (° C.) | Power density | Pressure (m Torr) | Film thickness (nm) |
|---|---|---|---|---|---|---|---|---|
| μc-Si | 1 | 200 | 20 | 0 | 360 | 160 | 900 | 300 |
| p$^-$ μc-Si | 2 | 100 | 0 | 50 | 280 | 324 | 900 | 60 |
| n$^-$ μc-Si | 2 | 100 | 0 | 12 | 280 | 324 | 900 | 60 |
| SiO$_2$ | 35 | 0 | 0 | 160 | 250 | 85 | 400 | 200 |

Figure 1B:
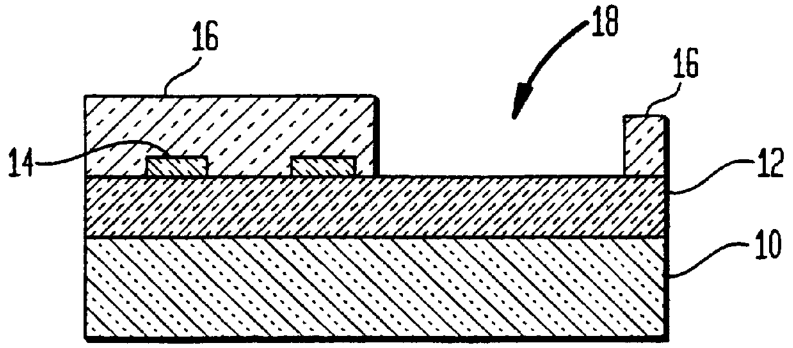
Figure 1C:
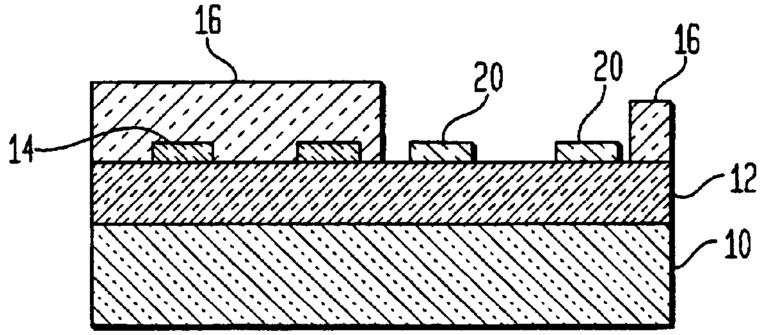
Figure 1D:
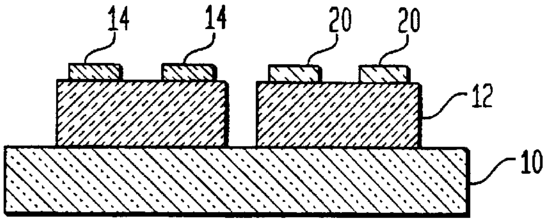
Figure 1E:
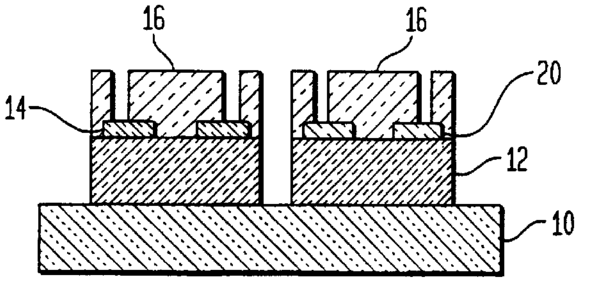
Figure 1F:
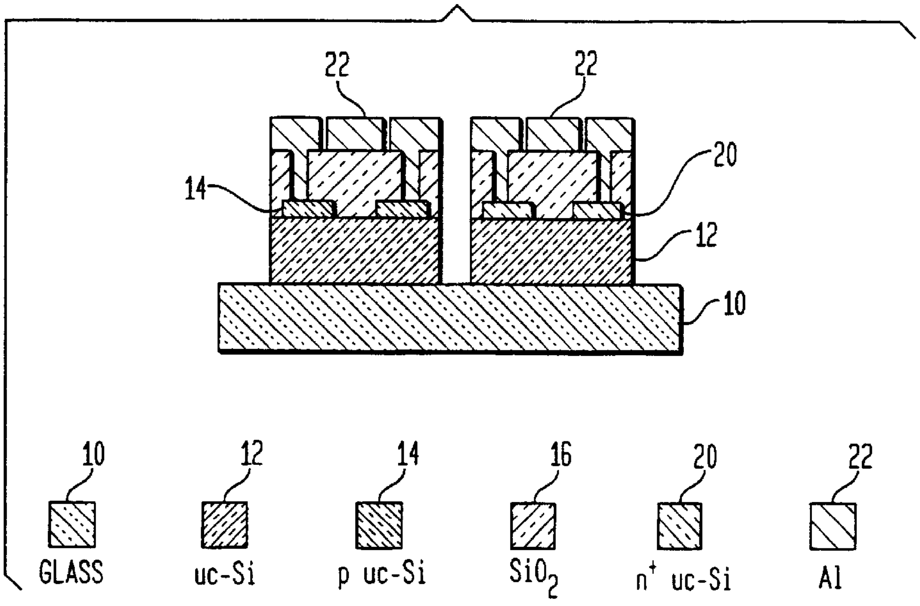

The TFTs were made in the top-gate configuration shown in FIGS. 1A–1F. The CMOS inverter is made of a p channel TFT and an n channel TFT of identical structure. A six-level mask process with specially designed masks was used in the inverter fabrication. First, 300 nm of i μc-Si and 60 nm of p$^+$ μc-Si layer 12 were grown on the substrate 10 without breaking vacuum. Next, as shown in FIG. 1A, the p$^+$ μc-Si source and drain for the p channel TFT 14 were patterned using reactive ion etching (RIE) with 10% O$_2$ and 90% CCl$_2$F$_2$. As shown in FIG. 1B, the deposition of a layer of 200 nm isolation SiO$_2$ 16 followed. Referring to 16, a window 18 in the SiO$_2$ was opened using buffered oxide etch (BOE) to deposit a 60 nm n$^+$ μc-Si layer. After RIE patterning of the n$^+$ μc-Si source and drain for the n channel TFT 20, the SiO$_2$ layer was removed with BOE (FIG. 1D), and followed by the definition of the i μc-Si island using RIE. Then, as shown in FIG. 1E, 200 nm SiO$_2$ 16 was deposited as gate insulator, and the SiO$_2$ gate was patterned and contact holes opened to the n and p channel TFT source and drain using BOE. Then, as shown in FIG. 1F, Al 22 was thermally evaporated and patterned using a wet-etch to form the gate, source and drain electrodes of the n and p channel TFTs, as well as the metal interconnects between the two gates, and the p TFT drain in the n TFT source. Other metals or alloys, such as Al, Cr, Cu, Ti, Mo, or Ta, and their alloys could be used to form the electrodes. The pull-up p channel TFT and pull-down n channel TFT have 180-μm long channels. These large dimensions result from use of a laser printer for mask molding.

Figure 2A:
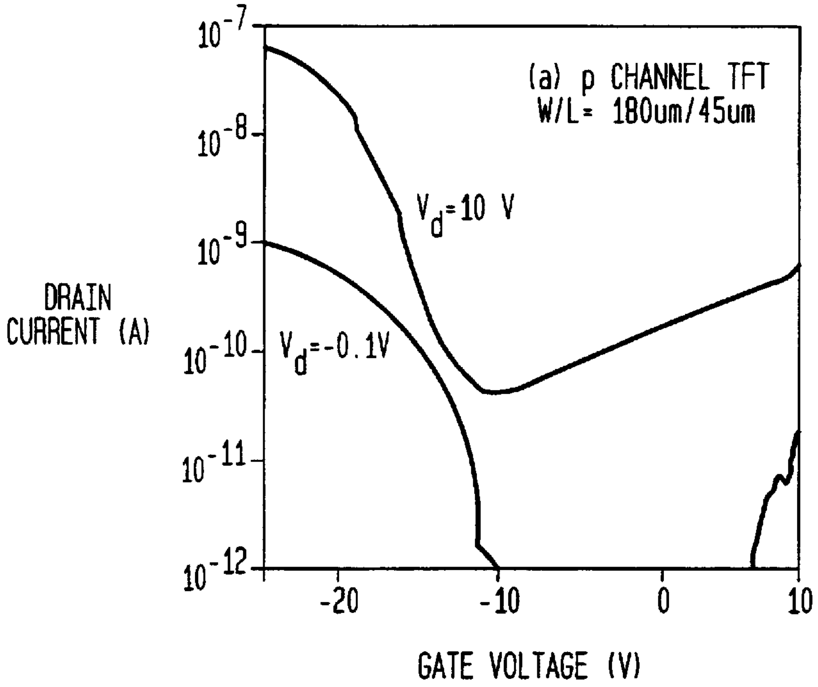
FIGS. 2A and 2B show the transfer characteristics of the (a) p channel μc-Si TFT, and (b) n channel μc-Si TFT of the CMOS inverter according to FIG. 1.
Figure 2B:
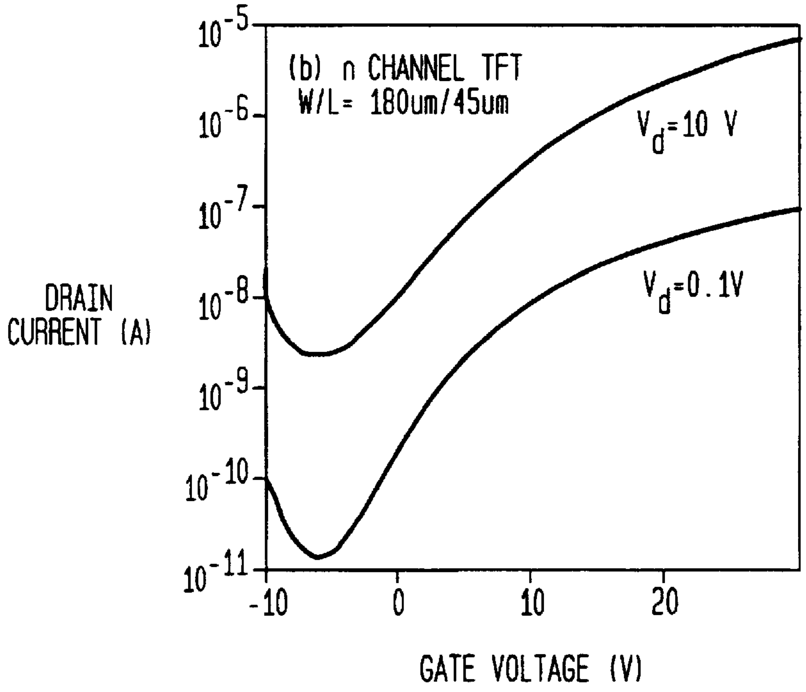

FIG. 2 shows the transfer characteristics of the p channel and n channel TFTs of the inverter. The ON current ION is defined as the drain current I$_d$ at a current, both at a drain voltage of V$_{ds}$ of (– or +) 10 V. FIG. 2A shows a p channel TFT ON/OFF current ration of >10$^3$, a threshold voltage V$_{TH}$ of –16 V, and a subthreshold slope S of 2.7 V/dec. The hole field-effect mobilities μ$_h$ Of the p channel TFT extracted from the linear and saturated regimes are 0.023 and 0.031 cm$^2$/Vs, respectively. The ON/OFF current ration of the n channel TFT of FIG. 2B is~10$^4$, its V$_{TH}$ is 3 V, and S=4.2 V/dec. The electron field-effect mobilities μ$_n$ of the n channel TFT extracted from the linear and saturated regimes are 0.72 and 1.0 cm$^2$Ns, respectively. These in μ$_n$ values lie substantially below those obtained in a separately fabricated μc-Si n channel TFT. We ascribe the reduction in field-effect mobility to the unoptimized process sequence for CMOS inverter fabrication, which also is reflected in the values for V$_{TH}$ and S.

Figure 3:
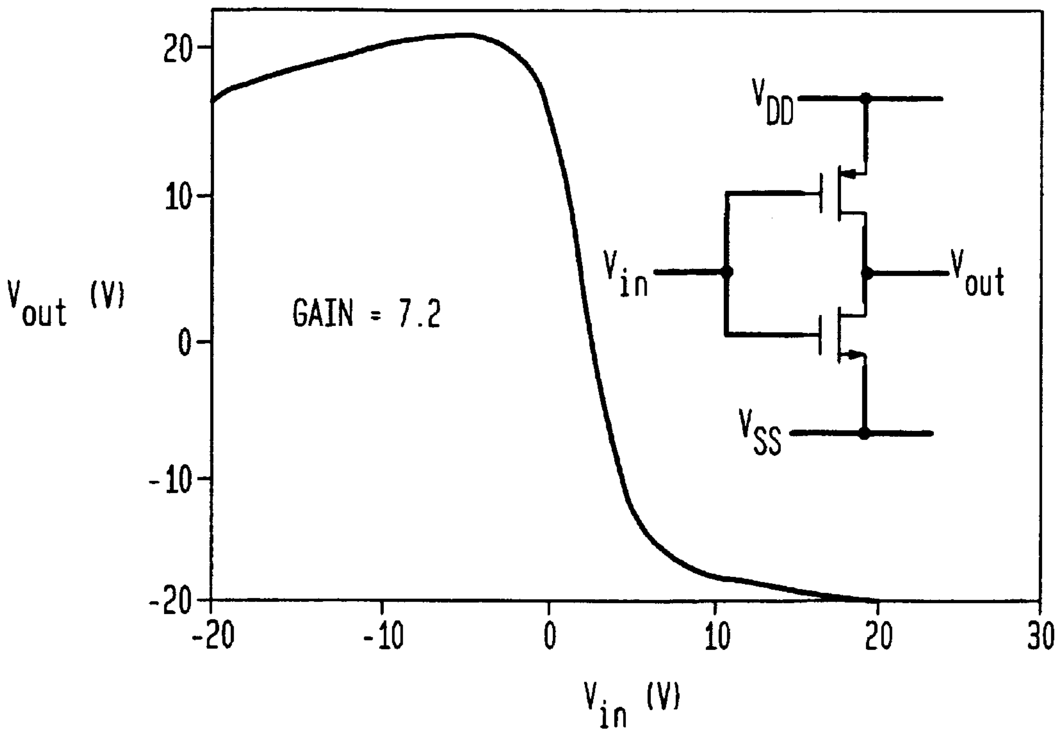
FIG. 3 shows the voltage transfer characteristics of a CMOS inverter made of μc-Si according to FIG. 1. The p channel and n channel TFTs have identical channel dimensions: $V_{DD}$=30 V and $V_{SS}$=–20 V.

The voltage transfer characteristic of the CMOS inverter made of the pull-up p channel TFT and the pull-down n channel TFT is shown in FIG. 3 for supply voltages of V$_{dd}$=30 V and V$_{ss}$=–20 V. The inverter exhibits a nearly full rail-to-rail swing, and an abrupt and well-defined voltage transfer characteristic with a gain of 7.2. The output HIGH is about 90% of the full voltage range and the output LOW is at the same voltage as V$_{ss}$.

Thus, the present invention introduces a new digital device and circuit technology based on directly deposited microcrystalline thin-film silicon. Its maximum process temperature of 320° C. is ideally suited to glass substrates, and of course is suitable to more refractory substrates such as steel. It also is suited as a complementary metal-oxide-silicon (CMOS) technology for add-on circuits to application-specific integrated circuits (ASICS):

Having thus described the invention in detail, it is to be understood that, the foregoing description is not intended to limit the spirit and scope thereof. What is desired to be protected by. Letters Patent is set forth in the appended claims.

What is claimed is:

1. A method of manufacturing a CMOS inverter comprising:

providing a substrate;

growing i μc-Si layer on the substrate;

growing p$^+$ μc-Si on the i μc-Si layer;

patterning the p$^+$ μc-Si source and drain for p channel TFT;

depositing isolation SiO$_2$ over the p channel TFT;

forming a window in the isolation SiO$_2$;

depositing an n$^+$ μc-Si layer on the i μc-Si layer through the window;

patterning the n$^+$ μc-Si source and drain for n channel TFT;

removing the isolation SiO$_2$ layer;

defining an i μc-Si island;

depositing SiO$_2$ as a gate insulator;, patterning the SiO$_2$ gate;

opening contact holes to the n and p channel TFT source and drain; and evaporating and patterning metal to form gate source and drain electrodes of the n and p channel TFTs, and metal interconnects between the gates.

2. The method of claim 1 wherein the substrate is glass.

3. The method of claim 1 wherein the metal gate source and drain electrodes are made from one or more of the group comprising Al, Cr, Cu, Ti, Mo, Ta and their alloys.

4. The method of claim 1 wherein patterning the p$^+$ μc-Si is performed by reactive ion etching.

5. The method of claim 4 wherein reactive ion etching is conducted with 10% O$_2$ and 90% CCl$_2$F$_2$.

6. The method of claim 1 wherein the window in the isolation SiO$_2$ is opened with buffered oxide etch.

7. The method of claim 1 wherein the island is formed by reactive ion etching.

8. A method of manufacturing a CMOS inverter comprising:

providing a substrate;

growing i μc-Si layer on the substrate;

growing $n^+$ μc-Si on the i μc-Si layer;

patterning the $n^+$ μc-Si source and drain for n channel TFT;

depositing isolation $SiO_2$ over the n channel TFT;

forming a window in the isolation $SiO_2$;

depositing an $^{p+}$ μc-Si layer on the i μc-Si layer through the window;

patterning the $p^+$ μc-Si source and drain for p channel TFT;

removing the isolation $SiO_2$ layer;

defining an i μc-Si island;

depositing $SiO_2$ as a gate insulator;

patterning the $SiO_2$ gate;

opening contact holes to the n and p channel TFT source and drain; and evaporating and patterning metal to form gate source and drain electrodes of the n and p channel TFTs, and metal interconnects between the gates.

9. The method of claim 8 wherein the substrate is glass.

10. The method of claim 8 wherein the metal gate source and drain electrodes are made from one or more of the group comprising Al, Cr, Cu, Ti, Mo, Ta and their alloys.

11. The method of claim 8 wherein patterning the $p^+$ μc-Si is performed by reactive ion etching.

12. The method of claim 11 wherein reactive ion etching is conducted with 10% $O_2$ and 90% $CCl_2F_2$.

13. The method of claim 8 wherein the window in the isolation $SiO_2$ is opened with buffered oxide etch.

14. The method of claim 8 wherein the island is formed by reactive ion etching.

15. A method of manufacturing a CMOS inverter comprising:

providing a substrate;

growing i μc-Si layer on the substrate;

growing and patterning one of a $p^+$ or $n^+$ μc-Si on the i μc-Si layer;

depositing and patterning the other of an $n^+$ or $p^+$ μc-Si on the i μc-Si layer;

depositing $SiO_2$ as a gate insulator;

patterning the $SiO_2$ gate;

opening contact holes in n and p channel TFT source and drain; and evaporating and patterning metal to form gate source and drain electrodes of the n and p channel TFTs and metal interconnects between the gates.

16. The method of claim 15 wherein the metal gate source and drain electrodes are made from one or more of the group comprising Al, Cr, Cu, Ti, Mo, Ta and their alloys.

17. A complementary metal-silicon oxide-silicon (CMOS) inverter comprising:

a substrate;

a microcrystalline silicon (μc-Si) layer on the substrate;

a p channel thin film transistor (TFT) on the μc-Si film;

an n channel TFT on the μc-Si film;

a patterned gate insulator on the n and p channel TFTs; and metal gate source and drain electrodes interconnected with the n and p channel TFTs.

18. The CMOS inverter of claim 17 wherein the metal gate source and drain electrodes are made from one or more of the group comprising Al, Cr, Cu, Ti, Mo, Ta and their alloys.

19. The apparatus of claim 18 further comprising an island in the μc-Si layer separating the n and p channel TFTs.

* * * * *

UNITED STATES PATENT AND TRADEMARK OFFICE

CERTIFICATE OF CORRECTION

PATENT NO. : 6,713,329 B1 
DATED : March 30, 2004
INVENTOR(S) : Sigurd Wagner and Yu Chen It is certified that error appears in the above-identified patent and that said Letters Patent is hereby corrected as shown below:

Column 4,
Line 51, please delete the comma after the word “insulator;” and “patterning the $SiO_2$ gate;” should be brought down to the next line.

Column 5,
Line 13, “$^{p+}$” is superscript, however only the “+” should be superscript. Accordingly, please replace “$^{p+}$” with -- $p^+$. --

Signed and Sealed this

Seventh Day of September, 2004

JON W. DUDAS
*Director of the United States Patent and Trademark Office*